United States Patent [19]

Gallup

[11] Patent Number: 4,516,251

[45] Date of Patent: May 7, 1985

[54] PROGRAMMABLE PRESCALER

[75] Inventor: Michael G. Gallup, Austin, Tex.

[73] Assignee: Motorola, Inc., Schaumburg, Ill.

[21] Appl. No.: 501,315

[22] Filed: Jun. 6, 1983

[51] Int. Cl.³ .............................................. H03K 21/36
[52] U.S. Cl. .................................... 377/110; 377/111;
377/114; 377/117
[58] Field of Search ............... 377/110, 111, 114, 116,
377/117

[56] References Cited

U.S. PATENT DOCUMENTS

| | | | |
|---|---|---|---|
| 3,287,648 | 11/1966 | Poole | 377/110 |
| 3,657,658 | 4/1972 | Kubo | 377/110 |
| 4,296,380 | 10/1981 | Minakuchi | 377/110 |
| 4,360,742 | 11/1982 | Freyman | 377/117 |
| 4,413,350 | 11/1983 | Bond et al. | 377/114 |

Primary Examiner—John S. Heyman
Attorney, Agent, or Firm—Anthony J. Sarli, Jr.; Jeffrey Van Myers; Robert L. King

[57] ABSTRACT

A prescaler circuit which provides an output signal which is synchronous with and proportional in frequency to a clock signal is provided. A counter portion counts a predetermined number of cycles of the clock signal and provides a plurality of count signals after a predetermined number of clock signal cycles. A decoder portion is coupled to the counter portion and couples a reference voltage node to a decoder output in response to both an input control signal and the count signals. A latch portion is coupled to the decoder portion for holding the decoder output, and a delay portion is utilized to provide the scaled output signal after a predetermined amount of time delay. The prescaler utilizes both odd and even scaling factors.

12 Claims, 2 Drawing Figures

PROGRAMMABLE PRESCALER

TECHNICAL FIELD

This invention relates generally to prescaler circuits and, more particularly, to prescaler circuits which are programmable for providing various scaling factors.

BACKGROUND ART

A prescaler is a circuit which generates an output signal related to an input signal by a fractional scale factor. A typical example of a prescaler is a decade frequency divider which has an output frequency which is one tenth of the input frequency. Commonly known implementations of prescalers utilize static decode logic gates having inputs connected to binary control signals. The binary control signals are used to select a predetermined prescale rate, and the static decode logic is usually a one of $2^n$ decoder where n is the number of control signal bits. Outputs of the static decode logic gates are coupled to another decoder for selecting and providing the correctly scaled output signal. Other implementations utilize a counter circuit consisting of serial flip flop circuits which are used to obtain a fractional output signal from a clock signal. Each of the flip flop circuits has a static decode logic circuit coupled to each flip flop for decoding binary control signals which control the switching of a clock signal. Known prescaler circuits utilize considerable decode circuitry associated with a counter and are therefore disadvantageous where circuit size is an important design factor. Prescalers which utilize both even and odd fractional scale factors also require complex state decoding logic to provide the odd fractional scale factors. Further, additional flip flop circuitry is generally required if the prescaler output signal is made synchronous with the input signal.

SUMMARY OF THE INVENTION

Accordingly, an object of the present invention is to provide an improved programmable prescaler.

Another object of the present invention is to provide a prescaler which is software programmable and which provides both odd and even fractional scale factors.

Yet another object of the present invention is to provide a prescaler which requires no predecoding of fractional scaling control signal bits.

In carrying out the above and other objects, there is provided, in one form, a prescaler circuit which provides an output signal which is synchronous with and proportional in frequency to a clock signal. Counter means having an input coupled to the clock signal count a predetermined number of cycles of the clock and provide a plurality of counter signals. Each counter signal is provided after a predetermined number of clock signal cycles. Decoder means are coupled to the counter signals of the counter means and connected directly to a binary control signal. The binary control signal selects the frequency of the output signal as a predetermined even or odd scaled fraction factor of the frequency of the clock signal. In response to both the counter means and the binary control signal, the decoder means couple a reference voltage node to a decoder output. Latch means hold the output of the decoder means and are coupled to delay means for providing the output signal after a predetermined amount of time delay.

The above and other objects, features and advantages of the present invention will be more clearly understood from the following detailed description taken in conjunction with the accompanying drawings.

DESCRIPTION OF A PREFERRED EMBODIMENT

Figure 1:
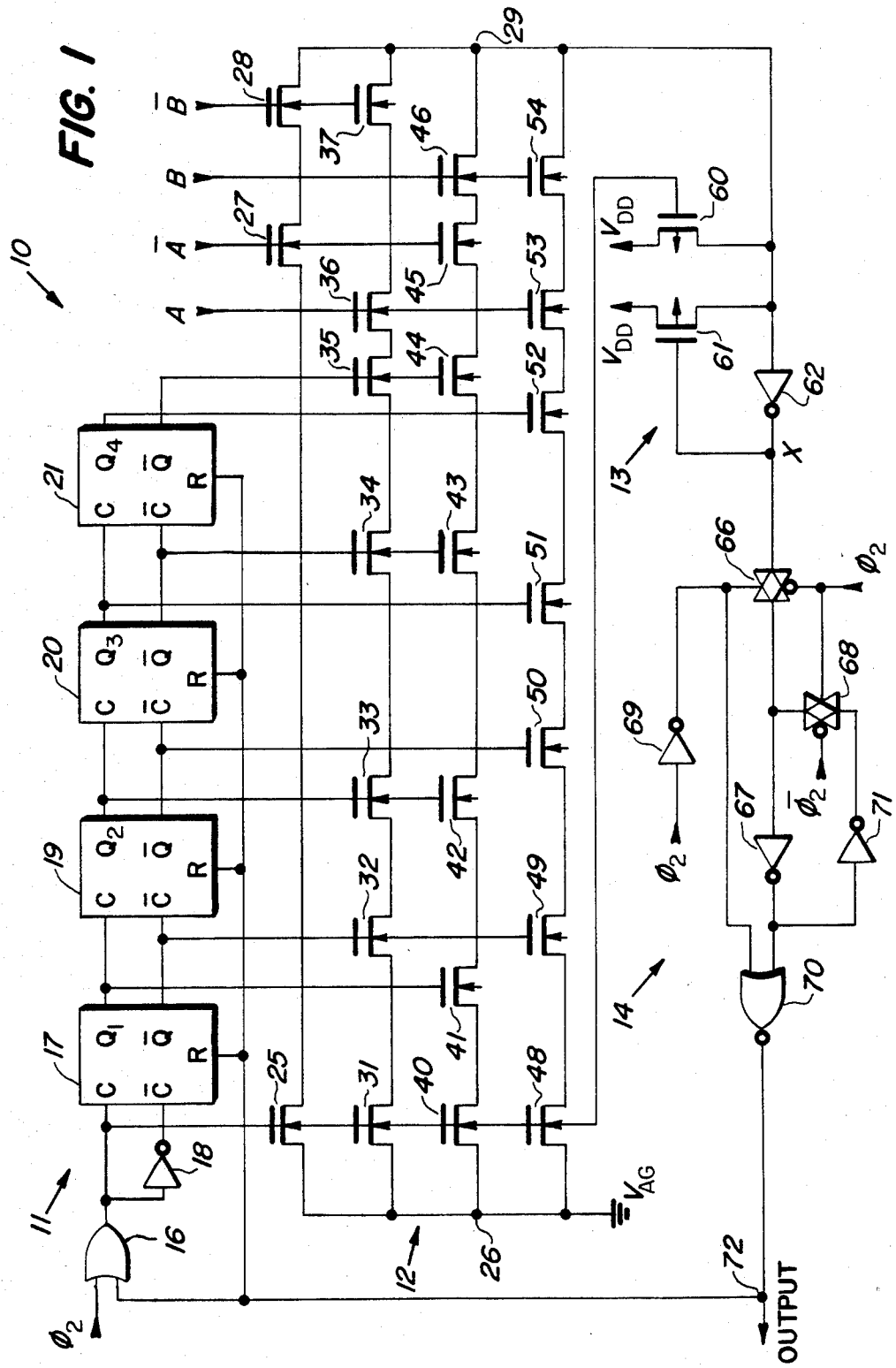
FIG. 1 illustrates in schematic form a programmable prescaler in accordance with a preferred embodiment of the present invention.

Shown in FIG. 1 is a programmable prescaler 10 constructed in accordance with a preferred embodiment and generally comprising a counter section 11, a decode section 12, a latch section 13 and a delay section 14. Although specific N-channel and P-channel MOS devices are shown, it should be clear that prescaler 10 could be implemented by completely reversing the processing techniques (e.g. P-channel to N-channel) or by using other types of transistors.

Counter section 11 comprises a NOR gate 16 having a first input coupled to a clock signal $\phi_2$, a second input and an output. A flip flop 17 has a first input labeled "C" coupled to the output of NOR gate 16. An inverter 18 has an input coupled to the output of NOR gate 16 and an output coupled to a second input of flip flop 17 labeled "$\overline{C}$". A first output of flip flop 17 labeled "$Q_1$" is coupled to a first input of a flip flop 19. A second output of flip flop 17 is coupled to a second input of flip flop 19. A first output of flip flop 19 labeled "$Q_2$" is coupled to a first input of a flip flop 20, and a second output of flip flop 19 is coupled to a second input of flip flop 20. A first output of flip flop 20 labeled "$Q_3$" is coupled to a first input of a flip flop 21, and a second output of flip flop 20 is coupled to a second input of flip flop 21 which has a first output labeled "$Q_4$" and a second output. The first inputs of flip flops 19, 20 and 21 are labeled "C" and the second inputs of flip flops 19, 20 and 21 are labeled "$\overline{C}$". The second outputs of flip flops 19, 20 and 21 are each labeled "$\overline{Q}$". Flip flops 17, 19, 20 and 21 each have a reset terminal labeled "R".

Decode section 12 comprises a decode transistor 25 having a first current electrode coupled to a reference voltage terminal 26 which is coupled to a reference voltage, say analog ground $V_{AG}$. A control electrode of decode transistor 25 is coupled to the output of NOR gate 16, and a second current electrode of decode transistor 25 is coupled to a first current electrode of a decode transistor 27. A control electrode of decode transistor 27 is coupled to a predetermined bit of a binary control signal labeled "A". A second current electrode of decode transistor 27 is coupled to a first current electrode of a decode transistor 28. A control electrode of decode transistor 28 is coupled to a predetermined bit of the binary control signal labeled "B", and a second current electrode of decode transistor 28 is coupled to a decode output terminal 29. A decode transistor 31 has a first current electrode coupled to reference voltage terminal 26, a control electrode coupled to the output of NOR gate 16, and a second current electrode coupled to a first current electrode of a decode transistor 32. Decode transistor 32 has a control electrode coupled to the second output of flip flop 17 and a second current electrode coupled to a first current electrode of a decode transistor 33. Decode transistor 33 has a control electrode coupled to the first output of flip flop 19 and a second current electrode coupled to a first current electrode of a decode transistor 34. A control electrode of decode transistor 34 is coupled to the second output of flip flop 20 and a second current electrode of decode transistor 34 is coupled to a first current electrode of a decode transistor 35. A control electrode of decode transistor 35 is coupled to the second output of flip flop 21, and a second current electrode of decode transistor 35 is coupled to a first current electrode of a decode transistor 36. A control electrode of decode transistor 36 is coupled to a predetermined bit of the binary control signal labeled "A", and a second current electrode of decode transistor 36 is coupled to a first current electrode of a decode transistor 37. A control electrode of decode transistor 37 is coupled to bit $\overline{B}$ of the binary control signal, and a second current electrode of decode transistor 37 is coupled to decode output terminal 29. A decode transistor 40 has a first current electrode coupled to reference voltage terminal 26, a control electrode coupled to the output of NOR gate 16, and a second current electrode coupled to a first current electrode of a decode transistor 41. A control electrode of decode transistor 41 is coupled to the first output of flip flop 17, and a second current electrode of decode transistor 41 is coupled to a first current electrode of a decode transistor 42. A control electrode of decode transistor 42 is coupled to the first output of flip flop 19, and a second current electrode of decode transistor 42 is coupled to a first current electrode of a decode transistor 43. A control electrode of decode transistor 43 is coupled to the second output of flip flop 20, and a second current electrode of decode transistor 43 is coupled to a first current electrode of a decode transistor 44. Decode transistor 44 has a control electrode coupled to the second output of flip flop 21 and a second current electrode coupled to a first current electrode of a decode transistor 45. Decode transistor 45 has a control electrode coupled to bit $\overline{A}$ of the binary control signal and a second current electrode coupled to a first current electrode of a decode transistor 46. Decode transistor 46 has a control electrode coupled to a predetermined bit of the binary control signal labeled "B" and a second current electrode coupled to decode output terminal 29. A decode transistor 48 has a first current electrode coupled to reference voltage terminal 26, a control electrode coupled to the output of NOR gate 16 and a second current electrode coupled to a first current electrode of a decode transistor 48. Decode transistor 49 has a control electrode coupled to the second output of flip flop 17 and a second current electrode coupled to a first current electrode of a decode transistor 50. Decode transistor 50 has a control electrode coupled to the second output of flip flop 19 and a second current electrode coupled to a first current electrode of a decode transistor 51. A control electrode of decode transistor 51 is coupled to the first output of flip flop 20, and a second current electrode of decode transistor 51 is coupled to a first current electrode of a decode transistor 52. Decode transistor 52 has a control electrode coupled to the first output of flip flop 21 and a second current electrode coupled to a first current electrode of a decode transistor 53. A control electrode of decode transistor 53 is coupled to bit A of the binary control signal, and a second current electrode of decode transistor 53 is coupled to a first current electrode of a decode transistor 54. Decode transistor 54 has a control electrode coupled to bit B of the binary control signal and a second current electrode coupled to decode output terminal 29. In a preferred form, all decode transistors are N-channel transistors.

Latch section 13 comprises a latch preset transistor 60 having a first current electrode coupled to a supply voltage $V_{DD}$, a control electrode coupled to the output of NOR gate 16 and a second current electrode coupled to decode output terminal 29. A latch transistor 61 has a first current electrode coupled to supply voltage $V_{DD}$, a control electrode and a second current electrode. An inverter 62 has an input coupled to the second current electrode of latch transistor 61 and an output for providing a signal labeled "X" which is coupled to the control electrode of latch transistor 61. The input of inverter 62 is also coupled to the decode output terminal 29. In a preferred form, transistors 60 and 61 are P-channel transistors.

Delay means 14 comprise a switch 66 having a first current electrode coupled to the output of inverter 62 and a second current electrode coupled to both an input of an inverter 67 and a first current electrode of a switch 68. Clock signal $\phi_2$ is coupled to an input of an inverter 69 which has an output coupled to a first control electrode of first conductivity type of switch 66. Clock signal $\phi_2$ is coupled to a second control electrode of second conductivity type of switch 66 and is also coupled to a first control electrode of switch 68. A complementary clock signal, $\overline{\phi}2$, is coupled to a second control electrode of a second and opposite conductivity type of switch 68. An output of inverter 67 is coupled to both a first input of a NOR gate 70 and an input of an inverter 71. An output of inverter 71 is coupled to a second current electrode of switch 68. A second input of NOR gate 70 is coupled to the output of inverter 69. An output of NOR gate 70 is coupled to a prescaler output terminal 72, to a second input of NOR gate 16 and to the reset terminal of flip flops 17, 19, 20 and 21. In a preferred embodiment, switches 66 and 68 are CMOS transmission gates which are clocked in a conventional manner by clock signal $\phi_2$. Switch 66 is constructed to be conductive when clock signal $\phi_2$ is at a low state and nonconductive when clock signal $\phi_2$ is at a high state. Conversely, switch 68 is constructed to be conductive when clock signal $\phi_2$ is at a high state and nonconductive when clock signal $\phi_2$ is at a low state.

Figure 2:
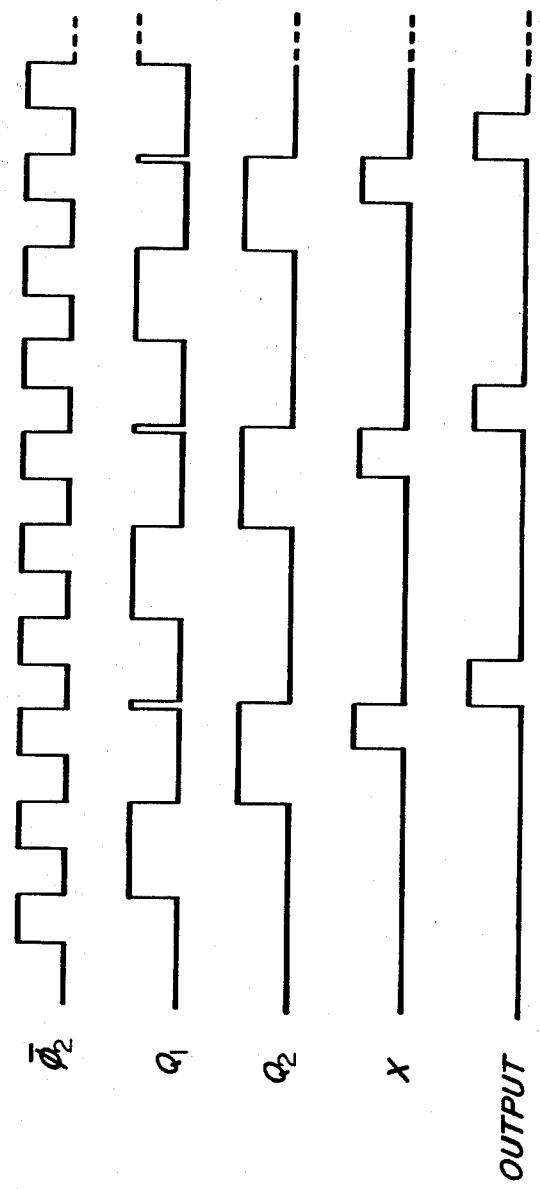
FIG. 2 illustrates in graphical form waveforms associated with the decoder circuit of FIG. 1.

In operation, a complementary clock signal $\overline{\phi_2}$ is provided at the output of NOR gate 16 having a predetermined frequency as illustrated in FIG. 2 and is coupled to counter means 11. Assuming that the output signal is initially at a low state, the output of NOR gate 16 will change state every time clock signal $\phi_2$ changes. Flip flops 17, 19, 20 and 21 function to count the number of changes in logic levels of clock signal $\phi_2$. Every time clock signal $\overline{\phi}2$ changes logic level from a high level to a low level, a change in logic level of the $Q_1$ output of flip flop 17 occurs. Every time clock signal $Q_1$ changes its logic level from a high level to a low level, a change in logic level of the output signal of flip flop 19 occurs. The binary control signal is illustrated as having four bits, A $\overline{A}$ B $\overline{B}$, where bit A is the most significant bit, and is coupled to decode section 12 for programmably selecting a predetermined divide rate for prescaler 11. In the illustrated embodiment, decode transistors 25, 27 and 28 are enabled to couple reference voltage $V_{AG}$ to decode output terminal 29 to provide a prescaler output which has a frequency which is equal to the frequency of clock signal $\phi_2$. In other words, the divide factor is one. Decode transistors 31, 32, 33, 34, 35, 36 and 37 are enabled to couple reference voltage $V_{AG}$ to decode output terminal 29 to provide a prescaler output which has a frequency which is equal to one-third of the frequency of clock signal $\phi_2$. Thus, the divide factor is three. Decode transistors 40, 41, 42, 43, 44, 45 and 46 are enabled to couple reference voltage $V_{AG}$ to decode output terminal 29 to provide a prescaler output which has a frequency which is equal to one-fourth of the frequency of clock signal $\phi_2$. Decode transistors 48, 49, 50, 51, 52, 53 and 54 are enabled to couple reference voltage $V_{AG}$ to decode output terminal 29 to provide a prescaler output which has a frequency which is equal to one-thirteenth of the frequency of clock signal $\phi_2$.

Shown in FIG. 2 is an illustration of waveforms associated with prescaler 10 when a binary input control signal of 1001 corresponding to A $\overline{A}$ B $\overline{B}$ is coupled to decode section 12. The example control signal makes decode transistors 36 and 37 conductive thereby selecting a divide by three prescale factor. Initially, assume that flip flops 17, 19, 20 and 21 have been reset so that the outputs $Q_1$, $Q_2$, $Q_3$ and $Q_4$ are at a low logic level. In a preferred form, as previously mentioned flip flops 17, 19, 20 and 21 are toggle flip flops which respond by providing a high logic level output at a Q output terminal in response to a negative going clock edge. Therefore, the $Q_1$ output goes to a logic high level after clock signal $\overline{\phi_2}$ transitions to a low logic level. The $Q_1$ output signal remains at a high logic level until clock signal $\overline{\phi_2}$ has another negative going clock edge. The second negative going clock edge of clock signal $\overline{\phi_2}$ results in a low logic level at the $Q_1$ output and a high logic level at the $Q_2$ output. At this time, decode transistors 32, 33, 34, 35, 36 and 37 are conductive. Upon the next rising or positive edge of clock signal $\overline{\phi_2}$, decode transistor 31 is also made conductive which results in reference node 26 being immediately coupled to decode output terminal 29. Simultaneously, clock signal $\overline{\phi_2}$ causes preset latch transistor 60 to be nonconductive. Preset transistor 60 presets decode output terminal 29 and resets the output of inverter 62. If reference voltage $V_{AG}$ is at a low logic level signal, then signal X at the output of inverter 62 is at a high logic level as shown in FIG. 2 thereby disabling latch transistor 61. Before reference node 26 is coupled to decode output terminal 29, transistor 61 latches a low logic level to the output of inverter 62.

Once signal X transitions to a high logic level, delay means 14 function to delay and latch signal X one-half cycle of clock signal $\phi_2$ before the output signal transitions to a high logic level. The delay is accomplished by making switch 66 nonconductive when clock signal $\phi_2$ is at a high logic level and by making switch 68 conductive. At the point in time when $\overline{\phi_2}$ transitions from a high logic level to a low logic level, signal X is latched internally thru the operation of inverters 67 and 71. Inverters 67 and 69 immediately couple a low logic level to both the first and second inputs of NOR gate 70. Therefore, when $\overline{\phi_2}$ transitions from a high logic level to a low logic level, the output signal at terminal 72 transitions from a low logic level to a high logic level. Since the output signal is coupled to the reset terminal of flip flops 17, 19, 20 and 21, all flip flops are immediately reset and the $Q_1$ and $Q_2$ outputs of flip flops 17 and 19, respectively, are reset to a low logic level. When clock signal $\phi_2$ transitions back to a high logic level, the output signal returns to a low logic level. Further level changes in clock signal $\phi_2$ do not change the output of NOR gate 70 until signal X returns to a high logic level again. The above described circuit operation then becomes repetitive. The $Q_3$ and $Q_4$ outputs of flip flops 20 and 21, respectively, never change logic level for a divide by three prescale operation. As a result of delay means 14, n−1 separate pulses of the $\phi_2$ clock signal must occur before signal X transitions logic levels to provide a prescaled output signal which has a frequency which is 1/nth of the $\phi_2$ clock signal, where n is an integer. Thus, counter section 11 functions to count a binary value associated with a clock signal input in response to an input control signal which determines the prescaled output signal rate. Decode section 12 functions to decode the numeric counted value. Prescaler 10 operates in an analogous manner for other input control signals to provide other programmed prescaled output signals. The control signals may be software programmed or programmed otherwise.

By now it should be apparent that a prescaler circuit which is simple and which requires no predecoding is provided. Static logic gates have been reduced and a one of n type decoder commonly associated with previous circuits has been eliminated. By utilizing the decode transistors of decode section 12, circuitry and space has been greatly reduced from previous predecoder circuits which predecode control signals. By utilizing the delay section 14, multiple odd divide rates may be provided in addition to providing even divide rates. This eliminates complex state decoding logic commonly associated with previous circuits which provided an analogous function. A plurality of divide rates of any rate may be provided by modifying decode section 12 to operate analogous to the circuit operation explained in detail. Further, to provide software programmability, a rate control register (not shown) may be used to enable software to manipulate the state of the bits of the encoded control signal.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A programmable prescaler for providing an output signal which is synchronous with and proportional in frequency to a clock signal, comprising:
    a plurality of series-connected flip flop circuits, a first of the flip flop circuits having an input coupled to the clock signal, the flip flop circuits counting a predetermined number of cycles of the clock signal, each of the flip flops providing a counter signal after a predetermined number of clock signal cycles and each having a reset terminal connected to an output of the prescaler;
    decoder means coupled to the plurality of flip flop circuits and connected to an input control signal for scaling the frequency of the output signal to a predetermined fraction of the frequency of the clock signal, the decoder means coupling a reference voltage node to a decoder output in response to at least one of the counter signals;
    latch means having an input coupled to the decoder output, and having an output for temporarily providing a latched output; and
    delay means having an input coupled to the output of the latch means, and having an output connected to the reset terminal of each flip flop circuit of the plurality of flip flop circuits at the prescaler output, for providing the output signal after a predetermined amount of time delay.

2. A programmable prescaler for providing an output signal which is synchronous with and proportional in frequency to a clock signal, comprising:
   a first flip flop having the first and second inputs thereof coupled to said clock signal, first and second outputs for providing first and second counter signals, and a reset terminal;
   a second flip flop having the first and second inputs thereof coupled to the first and second outputs of the first flip flop, first and second outputs for providing third and fourth counter signals, and a reset terminal;
   a third flip flop having the first and second inputs thereof coupled to the first and second outputs of the second flip flop, first and second outputs for providing fifth and sixth counter signals, and a reset terminal;
   a fourth flip flop having the first and second inputs thereof coupled to the first and second outputs of the third flip flop, first and second outputs for providing seventh and eighth counter signals, and a reset terminal, wherein said first, second, third and fourth flip flops provide a plurality of counter signals after a predetermined number of clock signal cycles;
   decoder means coupled to the inputs and outputs of the first, second, third and fourth flip flop circuits and directly connected to an input control signal for scaling the frequency of the output signal to a predetermined fraction of the frequency of the clock signal, the decoder means coupling a reference voltage node to a decoder output in response to at least one of the counter signals;
   latch means having an input coupled to the decoder output, and having an output for temporarily providing a latched output; and
   delay means having an input coupled to the output of the latch means, and having an output for providing the output signal after a predetermined amount of time delay.

3. A programmable prescaler for providing an output signal which is synchronous with and proportional in frequency to a clock signal, comprising:
   counter means having an input coupled to the clock signal for counting a predetermined number of cycles of the clock signal and providing a plurality of counter signals, each of the counter signals being provided after a predetermined number of clock signal cycles;
   decoder means coupled to the counter means and directly connected to an input control signal for scaling the frequency of the output signal to a predetermined fraction of the frequency of the clock signal, the decoder means coupling a reference voltage node to a decoder output in response to at least one of the counter signals, comprising:
      a first plurality of decode transistors arranged in n rows, where n is an integer corresponding to the number of programmable prescale factors, each of said first plurality of decode transistors having a control electrode coupled to a predetermined one of the plurality of counter signals and a decode transistor in each row having a current electrode connected to the reference voltage node;
      a second plurality of decode transistors coupled to the first plurality of decode transistors arranged in the n rows, for coupling the reference voltage node to the decoder output via a predetermined row of decode transistors in response to the input control signal;
   latch means having an input coupled to the decoder output, and having an output for temporarily providing a latched output; and
   delay means having an input coupled to the output of the latch means, and having an output for providing the output signal after a predetermined amount of time delay.

4. The programmable prescaler of claim 3 wherein said decoder means comprise:
   n rows of decode transistors, where n is an integer corresponding to the number of programmable prescale factors, for coupling the reference voltage node to the decoder output terminal in response to both predetermined counter and input control signals.

5. The programmable prescaler of claim 4 wherein said n rows of decode transistors comprise:
   a first row of decode transistors for providing a scaling factor of one, comprising:
      a first decode transistor having a first current electrode coupled to the reference voltage node, a control electrode coupled to the clock signal, and a second current electrode;
      a second decode transistor having a first current electrode coupled to the second current electrode of the first decode transistor, a control electrode coupled directly to the encoded control signal, and a second current electrode; and
      a third decode transistor having a first current electrode coupled to the second current electrode of the second decode transistor, a control electrode coupled directly to the input control signal, and a second current electrode coupled to the decoder output;
   a second row of decode transistors for providing a scaling factor of one-third, comprising:
      a fourth decode transistor having a first current electrode coupled to the reference voltage node, a control electrode coupled to the clock signal, and a second current electrode;
      a fifth decode transistor having a first current electrode coupled to the second current electrode of the fourth decode transistor, a control electrode coupled to a predetermined one of the counter signals, and a second current electrode;
      a sixth decode transistor having a first current electrode coupled to the second current electrode of the fifth decode transistor, a control electrode coupled to a predetermined one of the counter signals, and a second current electrode;
      a seventh decode transistor having a first current electrode coupled to the second current electrode of the sixth decode transistor, a control electrode coupled to a predetermined one of the counter signals, and a second current electrode;
      an eighth decode transistor having a first current electrode coupled to the second current electrode of the seventh decode transistor, a control electrode coupled to a predetermined one of the clock signals, and a second current electrode;

a ninth decode transistor having a first current electrode coupled to the second current electrode of the eighth decode transistor, a control electrode coupled directly to the input control signal, and a second current electrode; and a tenth decode transistor having a first current electrode coupled to the second current electrode of the ninth decode transistor, a control electrode coupled directly to the input control signal, and a second current electrode coupled to the decoder output.

6. The programmable prescaler of claim 5 further comprising:

a third row of series-connected decode transistors having the current electrodes thereof coupled together, for providing a decoder output signal having a scaling factor of one-fourth the clock signal; and a fourth row of series-connected decode transistors having the current electrodes thereof coupled together, for providing a decoder output signal having a scaling factor of one-thirteenth the clock signal.

7. The programmable prescaler of claim 1 wherein the latch means further comprise:

a preset transistor having a first current electrode coupled to a supply voltage terminal, a second current electrode coupled to the decoder output, and a control electrode for receiving the clock signal;

a latch transistor having a first current electrode coupled to the supply voltage terminal, a second current electrode coupled to the decoder output, and a control electrode; and an inverter circuit having an input coupled to the second current electrodes of the preset transistor and the latch transistor, and an output coupled to both the control electrode of the latch transistor and the input of the delay means.

8. The programmable prescaler of claim 1 wherein the delay means comprise:

a first switch having a first current electrode coupled to the output of the latch means, a second current electrode, a first control electrode, and a second control electrode coupled to the clock signal;

a first inverter circuit having an input coupled to the clock signal, and an output coupled to the first control electrode of the first switch;

a NOR gate having a first input coupled to the output of the first inverter circuit, an output for providing the output signal, and a second input;

a second inverter circuit having an input coupled to the second input of the NOR gate, and an output;

a second switch having a first current electrode coupled to the output of the second inverter circuit, a second current electrode coupled to the second current electrode of the first switch, a first control electrode coupled to the clock signal, and a second control electrode coupled to the complement of the clock signal; and a third inverter circuit having an input coupled to the second current electrode of the second switch, and an output coupled to the second input of the NOR gate.

9. A method for programmably prescaling a clock signal to provide an output signal which is synchronous with and proportional in frequency to the clock signal, comprising the steps of:

providing a plurality of series-connected flip flop circuits for counting a predetermined number of cycles of the clock signal and providing a plurality of counter signals, each of the counter signals being provided after a predetermined number of clock signal cycles;

providing n rows of decoding transistors, where n is an integer corresponding to the number of of selectable prescale factors, wherein each row comprises at least one decode transistor coupled to a predetermined counter signal and at least one transistor having a control electrode for receiving an input control signal, to couple a reference voltage node to a latch node to provide the output signal in response to both the occurrence of a predetermined number of clock signal cycles and the input control signal;

selectively providing the output signal at an output node after a predetermined amount of time delay; and resetting the flip flop circuits in direct response to the output signal.

10. A prescaler circuit comprising:

a plurality of flip flop circuits coupled in series, each flip flop circuit having first and second inputs and outputs, each of said flip flop circuits providing a counter signal after a predetermined number of cycles of a clock signal coupled thereto;

n rows of decode transistors, where n is an integer corresponding to the number of selectable prescale factors, wherein each row comprises at least one decode transistor coupled to a predetermined counter signal and at least one decode transistor coupled directly to an input control signal, for coupling a reference voltage node to a decode output node in response to both predetermined counter and input control signals;

latch means having an input coupled to the decode output node, and an output for temporarily providing a latched output; and delay means having an input coupled to the output of the latch means, and an output for providing a prescaler output signal which is synchronous with the clock signal after a predetermined amount of time delay.

11. The prescaler circuit of claim 10 wherein the latch means further comprise:

a preset transistor having a first current electrode coupled to a supply voltage terminal, a second current electrode coupled to the decode output node, and a control electrode for receiving the clock signal;

a latch transistor having a first current electrode coupled to the supply voltage terminal, a second current electrode coupled to the decode output node, and a control electrode; and an inverter circuit having an input coupled to the second current electrodes of the preset transistor and the latch transistor, and an output coupled to both the control electrode of the latch transistor and the input of the delay means.

12. The programmable prescaler of claim 10 wherein the delay means further comprise:

a first switch having a first current electrode coupled to the output of the latch means, a second current electrode, a first control electrode, and a second control electrode coupled to the clock signal;

a first inverter circuit having an input coupled to the clock signal, and an output coupled to the first control electrode of the first switch;

a NOR gate having a first input coupled to the output of the first inverter circuit, an output for providing the output signal, and a second input;

a second inverter circuit having an input coupled to the second input of the NOR gate, and an output;

a second switch having a first current electrode coupled to the output of the second inverter circuit, a second current electrode coupled to the second current electrode of the first switch, a first control electrode coupled to the clock signal, and a second control electrode coupled to the complement of the clock signal; and a third inverter circuit having an input coupled to the second current electrode of the second switch, and an output coupled to the second input of the NOR gate.

* * * * *